(12) United States Patent
Adachi et al.

(10) Patent No.: US 7,329,947 B2
(45) Date of Patent: Feb. 12, 2008

(54) HEAT TREATMENT JIG FOR SEMICONDUCTOR SUBSTRATE

(75) Inventors: Naoshi Adachi, Tokyo (JP); Kazushi Yoshida, Tokyo (JP); Yoshiro Aoki, Tokyo (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 327 days.

(21) Appl. No.: 10/750,883

(22) Filed: Jan. 5, 2004

(65) Prior Publication Data
US 2005/0098877 A1 May 12, 2005

(30) Foreign Application Priority Data
Nov. 7, 2003 (JP) ............... 2003-378724

(51) Int. Cl.
*F27D 5/00* (2006.01)
*H01L 23/34* (2006.01)
*H01L 21/48* (2006.01)
*C30B 31/00* (2006.01)
*C30B 31/14* (2006.01)

(52) U.S. Cl. .............. 257/706; 257/E21.279; 257/702; 257/712; 257/48; 257/668; 257/732; 438/125; 438/680; 211/41.18; 432/258; 432/253; 432/152; 432/241; 432/11; 427/255; 414/160; 414/287; 414/332; 414/403; 414/935

(58) Field of Classification Search ........ 257/E21.279, 257/706, 702, 712, 48, 668.732, 773, 707; 432/253, 358, 152, 241, 11; 211/41.18; 438/125, 438/680; 427/255; 414/160, 287, 332, 403, 414/935
See application file for complete search history.

(56) References Cited

U.S. PATENT DOCUMENTS

| 5,431,561 | A | * | 7/1995 | Yamabe et al. | ............. | 432/253 |
| 6,065,615 | A | * | 5/2000 | Uchiyama et al. | ........ | 211/41.18 |
| 6,093,644 | A | * | 7/2000 | Inaba et al. | ................. | 438/680 |
| 6,204,194 | B1 | * | 3/2001 | Takagi | ........................ | 438/758 |
| 6,491,518 | B1 | * | 12/2002 | Fujikawa et al. | ........... | 432/241 |
| 6,607,381 | B2 | * | 8/2003 | Minami et al. | ............. | 432/258 |
| 6,796,439 | B2 | * | 9/2004 | Araki | ...................... | 211/41.18 |
| 2002/0172908 | A1 | * | 11/2002 | Minami et al. | ............. | 432/253 |

(Continued)

FOREIGN PATENT DOCUMENTS

JP 09-199438 7/1997

(Continued)

*Primary Examiner*—Alexander Oscar Williams
(74) *Attorney, Agent, or Firm*—Clark & Brody

(57) ABSTRACT

When a two-division structure heat treatment jig for semiconductor substrate that includes a silicon first jig that comes into direct contact with a semiconductor substrate that is heat treated and supports the semiconductor substrate, and a second jig (holder) that holds the first jig and is mounted on a heat treatment boat is adopted as a heat treatment boat of a vertical heat treatment furnace, the stress concentrated during the heat treatment on a particular portion of the semiconductor substrate can be reduced; in the case of a semiconductor substrate large in the tare stress and having an outer shape of 300 mm being heat treated, or even in the case of the heat treatment being carried out under very high temperature conditions, the slips can be suppressed from occurring. The present invention can be widely applied as a stable heat treatment method of semiconductor substrates.

8 Claims, 7 Drawing Sheets

U.S. PATENT DOCUMENTS

2002/0187023 A1 * 12/2002 Araki .................. 414/160

FOREIGN PATENT DOCUMENTS

| JP | 10-270369 | | 10/1998 |
| JP | 11-340155 | * | 12/1999 |
| JP | 2001-358086 | | 12/2001 |
| JP | 2002-43239 | * | 8/2002 |
| JP | 2003-037112 | | 2/2003 |
| JP | 2003-100648 | * | 4/2003 |
| JP | 2003-197722 | * | 7/2003 |

* cited by examiner

HEAT TREATMENT JIG FOR SEMICONDUCTOR SUBSTRATE

BACKGROUND OF THE INVENTION

1. Field of the Invention

The present invention relates to a heat treatment jig that is used in a heat treatment boat of a vertical heat treatment furnace and a heat treatment method, and in more detail, to a heat treatment jig for a semiconductor substrate that can suppress slip generated as a crystal defect when the semiconductor substrate is heat treated at a high temperature from occurring and a heat treatment method therewith.

2. Description of the Related Art

A semiconductor substrate that is processed in an LSI device fabrication process, in steps of oxidation, diffusion and film deposition, is repeatedly subjected to high temperature heat treatment to fabricate. At the time of the heat treatment, when an inhomogeneous temperature distribution is caused within a plane of the semiconductor substrate, in accordance therewith the thermal stress is generated in the semiconductor substrate.

On the other hand, depending on a supporting method of the semiconductor substrate, owing to a weight of a wafer (substrate), the stress (hereinafter referred to simply as "tare stress") is generated. In an existing heat treatment boat, in the case of the silicon substrate being supported only by a periphery portion thereof, when a semiconductor substrate having a diameter of 300 mm is heat treated, the tare stress is largely generated, resulting in difficulty to use.

It is known that the thermal stress and the tare stress generate, in the heat treatment, crystal defect called the slip in the semiconductor substrate. The slip causes an increase in the leakage current of the LSI device and deteriorates the planarity of the semiconductor substrate. In order to secure the quality characteristics of the semiconductor substrate, in order to suppress the slip from occurring, it is important to reduce the thermal stress and the tare stress.

In heat treating the semiconductor substrate, a vertical heat treatment furnace can reduce an installation space and is suitable for heat treating a lot of semiconductor substrates having a large diameter; accordingly, it is adopted as apparatus that is used in various heat treatments of semiconductor substrates.

FIG. 1 is a diagram showing a configuration example of a heat treatment boat for use in semiconductor substrates that is used in the vertical heat treatment furnace. A heat treatment boat 1 includes three or more pillars 3 and a top panel 5 and a bottom panel 6 that fix these pillars 3 up and down positions, and is provided with an opening 2. The pillar 3 is provided with substrate supporting portions 4 arranged in parallel. After the semiconductor substrates are placed from a side of the opening 2 on the substrate supporting portions 4, the boat is inserted into the vertical heat treatment furnace followed by carrying out predetermined heat treatment.

As shown in FIG. 1, the heat treatment boat 1 is constituted of a pair of top and bottom panels 5, 6 disposed distanced with a separation and a plurality of pillars 3 that links the top and bottom panels; accordingly, the opening 2 is necessarily disposed to place the semiconductor substrates on the substrate supporting portions 4 or to take out therefrom. Accordingly, normally, two pillars 3 disposed on a side of the opening 2, in order to easily place or take out the semiconductor substrates, are disposed distanced with a separation substantially equal to a diameter of the semiconductor substrate.

In heat treating small diameter semiconductor substrates, a method has been widely used in which by use of the heat treatment boat 1 shown in FIG. 1, an outer periphery portion of a back surface of the substrate is supported at a plurality of points of substantially three or four points. However, with a recent increase in a diameter of the semiconductor substrate, largely increased tare stress became to be generated. As a result, in the method in which the outer periphery portion of a back surface of the substrate is supported at three or four points by means of the heat treatment boat 1 shown in FIG. 1, in accordance with an increase in the tare stress at the supporting points, the inhomogeneous distribution of the tare stress is forwarded, resulting in abundant generation of the slips.

Accordingly, recently, in order to reduce the occurrence of the slips in conjunction with an increase in the diameter of the semiconductor substrate, a jig that supports the inside of the back surface of the semiconductor substrate at a plurality of points, or a jig that supports the semiconductor substrate by a ring-like line contact or surface contact with the semiconductor substrate has been put into practical use.

By use of the jig that is put into practical use and supports the inside of the back surface of the semiconductor substrate, the slips that are caused when the semiconductor substrate is heat treated can be reduced. However, in order to reduce the slips with precision by use of these heat treatment jigs that have a structure in which contact method is altered, problems are newly caused.

For instance, since the back surface of the semiconductor substrate adheres to the supporting jig, the semiconductor substrate and the supporting jig each are restricted in the deformation. Accordingly, in some cases, large stress that exceeds the thermal stress or the tare stress may be added anew to the semiconductor substrate. In such a case, newly added stress generates the slip.

As a new cause of the slip generation, there is one due to the processing accuracy of the heat treatment jig itself; in particular, the slip generation largely depends on the flatness and the surface roughness of surfaces in a region where the back surface of the semiconductor substrate and the supporting jig come into contact.

Ordinarily, the heat treatment jig that is used in high temperature heat treatment is manufactured of silicon carbide. Accordingly, the flatness in a region where the semiconductor substrate and the supporting jig come into contact is 200 µm or less, and a jig surface has a structure where surface irregularities are locally put together.

In this connection, the present inventors have proposed a heat treatment method in which a silicon carbide holder having a thickness of less than 1 mm is disposed, thereon a silicon or silicon carbide ring or disc jig smaller in a diameter than the semiconductor substrate is disposed, and further thereon the semiconductor substrate is placed to perform the heat treatment (Japanese Patent Application Laid-open No. 2001-358086).

Similarly, the present inventors disclose a heat treatment jig in which on a silicon carbide heat treatment jig that is used in a vapor-phase growth method, a center protrusion that supports a center portion of a back surface of a semiconductor substrate and at least one circular arc that supports the back surface of the substrate are disposed, and on all or part of a contact surface of the center protrusion and the circular arc that come into contact with the semiconductor substrate a capping member is disposed (Japanese Patent Application Laid-open No. 2003-037112).

On the other hand, Japanese Patent Application Laid-open Nos. 9-199438 and 10-270369 due to other inventors than the present inventors disclose a method in which by use of a supporting jig formed into a disc-like or ring-like shape, silicon substrates are placed on these supporting jigs followed by applying heat treatment. However, these publications do not describe of the flatness of the disc-like or ring-like supporting jig and the aggregate of the concave and salient.

According to the heat treatment method proposed in Japanese Patent Application Laid-open No. 2001-358086, under very high temperature heat treatment conditions that exceed 1300° C. in the heat treatment temperature and are longer than 10 hours in the holding time period such as the heat treatment of SIMOX substrate, silicon carbide itself that constitutes the holder becomes weaker in the mechanical strength. Accordingly, since a thickness of the holder is less than 1 mm, the bending cannot be suppressed from occurring; as a result, also in the ring or disc jig that the holder supports, similarly the bending is generated. Finally, the slips are generated even in the semiconductor substrate.

As mentioned above, the reason for the slips being generated in the semiconductor substrate is due to the lack of the mechanical strength of the silicon carbide holder and furthermore the ring or disc jig that the holder supports under very high temperature heat treatment conditions. Furthermore, depending on the conditions of contact with the semiconductor substrate, the adherence at a contact surface between a small diameter disc or ring jig and the semiconductor substrate becomes stronger; accordingly, the slips due to local adherence also are generated.

Even when with the jig disclosed in Japanese Patent Application Laid-open No. 2003-037112, heights of the circular arc and the center protrusion on the holder are processed with precision, owing to the bending of the holder generated during the high temperature heat treatment, an error is generated between the heights of the circular arc and the center protrusion on the holder, resulting in difficulty in diminishing the slips.

In order to diminish the error generated during the high temperature heat treatment, a thick holder can be ground out of sintered silicon carbide, and therewith a center protrusion and a circular arc that are difficult to exhibit the bending can be fabricated. However, since manufacturing cost increases, this cannot be applied to industrial mass-production.

Furthermore, even when the disc-shaped or the ring-shaped supporting jig described in Japanese Patent Application Laid-open Nos. 9-199438 and 10-270369 is used, under the very high temperature heat treatment conditions, the slips occur in the semiconductor substrate. Thus, the use of the disc-shaped or ring-shaped supporting substrate alone cannot suppress the slips that are generated in conjunction with the heat treatment from occurring.

SUMMARY OF THE INVENTION

The present invention was performed in view of the above-mentioned problems and intends to provide a heat treatment jig for semiconductor substrates that in the case of a semiconductor substrate being heat treated by use of a heat treatment boat of a vertical heat treatment furnace, the stress applied on the semiconductor substrate can be diminished and thereby the slips can be suppressed from occurring, and a heat treatment method of semiconductor substrates therewith.

The present inventors, as a result of various investigations to achieve the above object, paid attention to that in the case of heat treatment being carried out by use of a heat treatment boat of a vertical heat treatment furnace, a heat treatment jig placed on a heat treatment boat is effectively constituted of a first jig that comes into direct contact with the semiconductor substrate to support and a second jig (hereinafter referred to simply as "a holder") that supports the first jig and is placed on the heat treatment boat.

After further studying, it was desirably found that as the optimization of jig materials, the first jig was constituted of silicon material, the holder was necessarily constituted of a material large in the high temperature strength such as silicon carbide, and furthermore the surface roughness and the surface flatness of the first jig and the holder are stipulated.

When the first jig made of silicon material is formed with the flatness of 100 μm or less and preferably 50 μm or less in a surface of a region that comes into direct contact with a semiconductor substrate to support, the first jig can stably support the semiconductor substrate. When the surface flatness exceeds 100 μm, the contact with the semiconductor substrate tends to be a point contact and the slips tend to be generated.

As the flatness defined in the present invention, one defined in JIS B 0621 is used.

A thickness in a region that comes into direct contact with the semiconductor substrate of the first jig is set at from 0.5 to 10 mm, and preferably from 0.7 to 5.0 mm. When the thickness is less than 0.5 mm, during the processing of the jigs, damage of the jigs is frequently caused, the yield decreases largely when the jigs are manufactured and at the same time the jig is largely influenced by the flatness of the holder. On the other hand, when the thickness exceeds 10 mm, the number of pieces of the semiconductor substrates that can be placed on a heat treatment boat decreases, resulting in lowering the productivity of the heat treatment.

The surface roughness in a region that comes into direct contact with a semiconductor substrate of the first jig is set at from 0.02 to 10 μm and preferably from 5.0 μm or less. When the surface roughness is less than 0.2 μm, the first jig is likely to adhere to the semiconductor substrate; on the other hand, when the surface roughness exceeds 10 μm, during the blasting to secure the surface roughness, the jig may be damaged.

In the first jig, even in a region that comes into contact with the holder, the surface roughness is set at from 0.02 to 10 μm and preferably 5.0 μm or less. The reason is the same as that in the case of the surface roughness in a region that comes into direct contact with the above-mentioned semiconductor substrate.

The surface roughness defined in the invention represents the centerline average roughness (Ra) defined in JIS B 0601.

The first jig is structured into a disc-like or ring-like shape and as far as a structure that can stably support the semiconductor substrate any structure can be applied. In the case of the jig structure being a ring-like or horseshoe shape, a width of the jig that comes into contact with the semiconductor substrate, that is, a ring width or a horseshoe width is preferably set at 0.5 mm or more.

Furthermore, in the first jig, when on a surface of a region that comes into direct contact with the semiconductor substrate any one of a silicon carbide film, an oxide film, or a poly-silicon film is formed, the slips can be further diminished.

When the flatness of a surface of a region where the holder and the first jig come into direct contact is made 200 μm or less and preferably 100 μm or less, the first jig can be stably held. That is, when the flatness of the holder is made 200 μm or less, during the high temperature heat treatment, the first jig can be inhibited from exhibiting the plastic deformation in conformity with the flatness of the holder.

A thickness in a region where the holder comes into direct contact with the first jig is set in the range of 0.5 to 10 mm. When the thickness thereof is less than 0.5 mm, the flatness of the holder cannot be processed with excellent precision; on the other hand, when the thickness thereof exceeds 10 mm, a heat content within the heat treatment boat increases, resulting in deteriorating the heating efficiency and reducing the number of pieces of semiconductor substrates that can be placed on the heat treatment boat.

The surface roughness in a region where the holder comes into direct contact with the first jig, in order to inhibit the holder from adhering to the first jig made of silicon material, is preferably set in the range of 0.02 to 10 μm.

The materials that the holder adopts can be selected according to heat treatment temperatures to be used. For instance, in the case of the heat treatment being repeated at for instance 1000° C. or more, silicon carbide and so on can be well adopted; in the case of the heat treatment being carried out at 1000° C. or less, quartz, silicon and so on may well be adopted.

As a structure of the holder, as far as the heat treatment jig can be stabilized, any structure can be applied. For instance, in order to reduce the heat content of the holder, it may be formed into a ring structure or a spot facing structure.

Furthermore, in order to stably use the heat treatment jig for a long time, in the case of a thickness of the holder being such thin as from 0.5 to 1.0 mm, a thickness of the first jig that the holder supports is preferably set at 1.0 mm or more. When the thickness of the holder exceeds 1.0 mm, the thickness of the first jig that the holder supports is preferably set at 0.5 mm or more.

When the above configuration is adopted, the heat treatment jig for semiconductor substrates according to the invention is constituted in a two-division structure that includes the first jig that comes into direct contact with the semiconductor substrate and supports the same and is formed of silicon material; and a second jig (holder) that supports the first jig and is placed on the heat treatment boat. With the configuration, as explained below, the slips that are generated in the semiconductor substrate can be effectively inhibited from occurring.

For instance, a case where in the case of a plurality of semiconductor silicon substrates having a diameter of 300 mm being put in a vertical heat treatment furnace to apply heat treatment, on a holder made of silicon carbide and having a diameter of 320 mm, a disc-shaped first jig made of a single crystal silicon material having a diameter of 200 mm is placed and thereon a semiconductor silicon substrate is placed will be considered.

In the heat treatment, an in-plane temperature difference of the disc-like first jig that has a diameter smaller than that of the holder becomes smaller than an in-plane temperature difference of the holder. Accordingly, the thermal stress applied on the semiconductor silicon substrate can be alleviated when the disc-like first jig is disposed. Furthermore, since the first jig is made of single crystal silicon material, the thermal expansion coefficient of the semiconductor silicon substrate is also the same; accordingly, it works advantageously on the deformation during the heat treatment.

In the case of local adhesion being generated between a back surface of the semiconductor silicon substrate and the first jig, as mentioned above, since the two division structure is adopted, the binding force does not work to each other between the holder and the first jig; accordingly, the semiconductor silicon substrate is not affected by the holder that is different in the thermal expansion coefficient.

In other words, in the heat treatment, the semiconductor silicon substrate is affected only by the first jig that has the same thermal expansion coefficient as the semiconductor silicon substrate; accordingly, the stress applied in the adhesion region can be reduced and the slips can be suppressed from generating. Furthermore, since the semiconductor silicon substrate and the first jig are made of materials identical also in the mechanical strength, bruise and damage in a contact region are generated with difficulty. Accordingly, also from such a point, it exhibits an effect in suppressing the slips from generating.

In the heat treatment jig for semiconductor substrate according to the invention, even when the first jig is formed with a diameter the same as or larger than that of the semiconductor silicon substrate, an effect due to the two-division structure can be obtained. As mentioned above, in addition to the thermal expansion coefficients and the mechanical strengths being the same, the jig on which the semiconductor silicon substrate is placed is divided; accordingly, the temperature difference in a thickness direction in the heat treatment jig, in comparison with that of an integral construction, is more reduced, resulting in more reducing the deformation of the holder and the first jig.

The heat treatment jig for semiconductor substrate according to the invention, when the first jig that uses silicon material is optimized and the holder itself that supports this is optimized, can be stably used under very high temperature heat treatment conditions such as the SIMOX heat treatment, and furthermore the slips generated in the semiconductor silicon substrate can be reduced.

In the case of an atmosphere of the heat treatment furnace being a non-oxidizing atmosphere such as a hydrogen gas atmosphere or an argon gas atmosphere and the heat treatment being carried out for a long time at 1000° C. or more, in order to inhibit silicon materials from strongly adhering to each other, it is effective to form an oxide film, a nitride film or a silicon carbide film on a surface of the first jig. Furthermore, even when an atmosphere of the heat treatment furnace is an oxidizing atmosphere, similarly, a film may be formed on a surface, or without forming a film it may be used as it is.

In the case of the slips being generated at a particular position of the semiconductor silicon substrate on the occasion of the heat treatment, when a surface of the first jig corresponding to the particular position is locally ground or polished with silicon material or silicon carbide material, the slips can be inhibited from occurring.

When the semiconductor silicon substrate and the first jig come into adhesion, the semiconductor silicon substrate is partially peeled and solidly adhered to the surface of the first jig, and thereby the slips are caused. However, by locally grinding or polishing, exfoliation adhered onto the surface of the first jig can be removed, and thereby causes of the slip can be eliminated.

When the above configuration is adopted, according to the heat treatment jig for semiconductor substrate of the invention, even in the case of a semiconductor wafer that has a diameter of 300 mm and is large in the tare stress being heat-treated at high temperatures, the slips generated as the crystal defect can be effectively inhibited from occurring.

DESCRIPTION OF THE PREFERRED EMBODIMENTS

In the following, modes for carrying out heat treatment jigs for use in semiconductor substrates according to the present invention that are placed on a heat treatment boat of a vertical heat treatment furnace will be detailed with reference to the drawings; however, the present invention is not restricted to these specific embodiments.

All substrates used in the following embodiments and comparative embodiments are silicon for semiconductor having a diameter of 300 mm. At this time, the heat treatment is carried out under the following conditions; that is, the temperature up is began from room temperature in a 50% oxygen atmosphere up to 1320° C., followed by maintaining there for 15 hr, further followed by lowering to room temperature. The semiconductor silicon substrates after the heat treatment were observed of the slip by use of surface defect evaluating apparatus (magic mirror and X-ray). In order to confirm the reproducibility for all conditions, 2 to 3 times of investigations were repeated.

EMBODIMENTS

In embodiments, with reference to FIGS. 2 through 10, configurations of ninth kinds of heat treatment jigs (10 to 90) will be explained.

Figure 1:
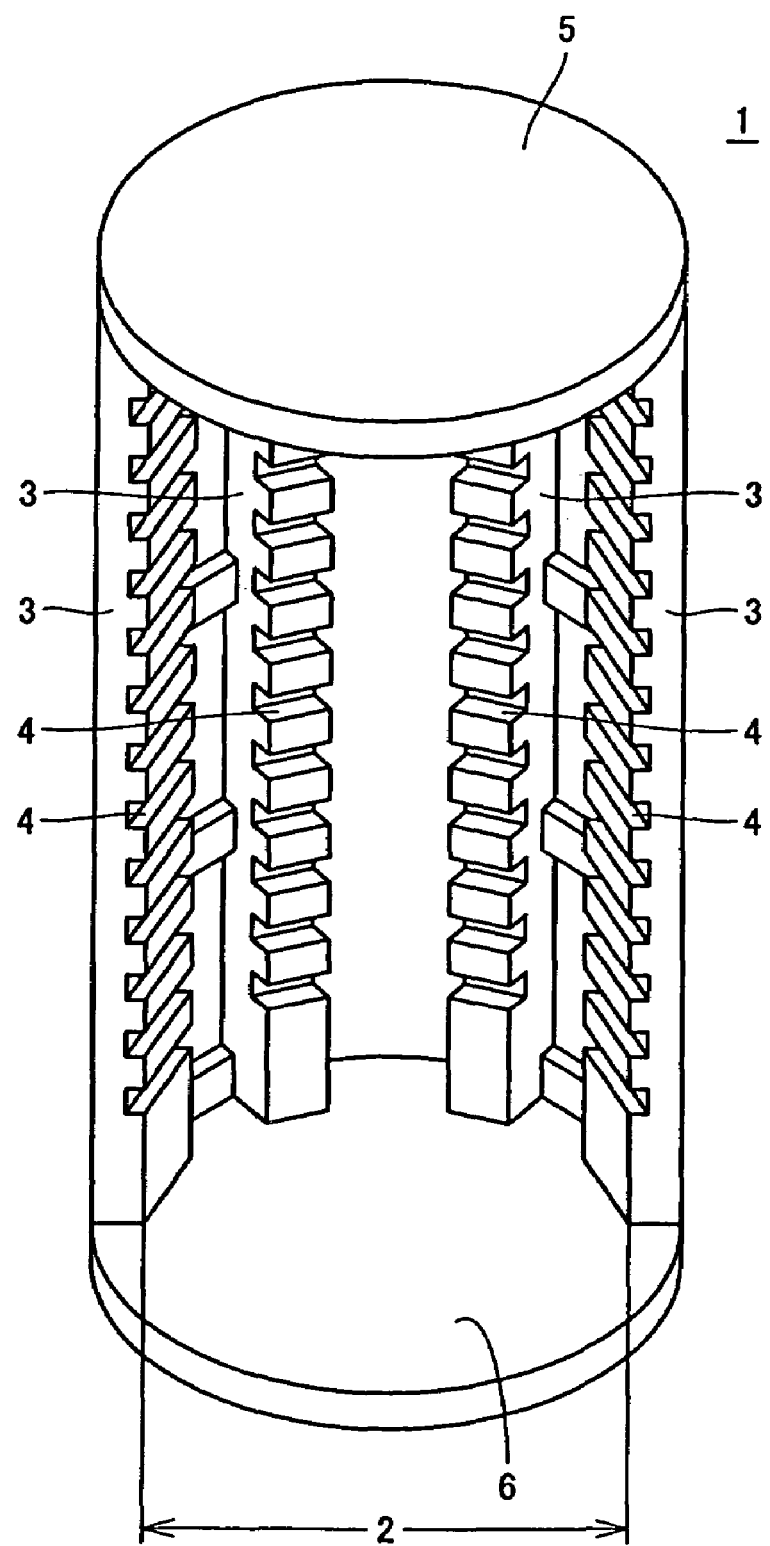
FIG. 1 is a diagram showing an example of a configuration of a heat treatment boat for use in semiconductor substrates that is used in a vertical heat treatment furnace.
Figure 2:
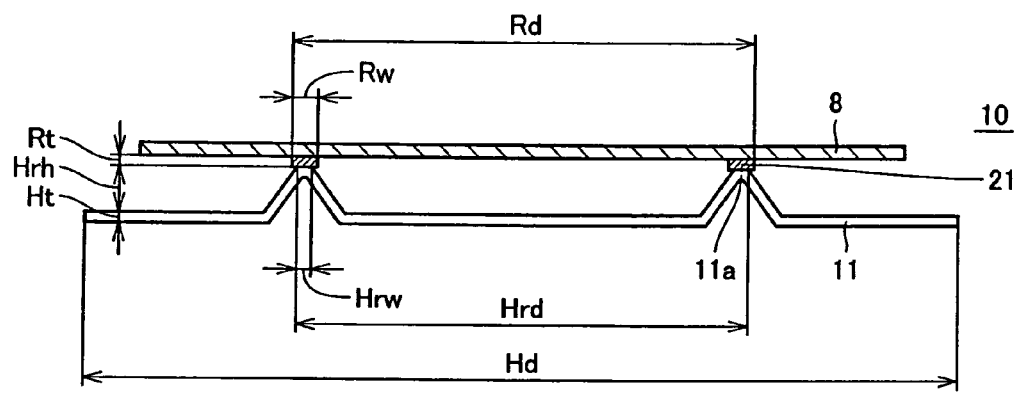
FIG. 2 is a diagram showing a configuration of a heat treatment jig 10 that is a first embodiment of the invention.

FIG. 2 is a diagram showing a configuration of a heat treatment jig 10 that is a first embodiment of the invention. A holder 11 that is used in the heat treatment jig 10 is made of vapor-phase grown silicon carbide and provided with a ring structure 11a.

The holder 11 has a diameter (Hd) of 320 mm and a thickness (Ht) of 1.3 mm; and the ring structure 11a has a diameter (Hrd) of 222 mm, a height (Hrh) of 3.5 mm and a width (Hrw) of 1.2 mm. The ring structure 11a of the holder 11 was subjected to the surface processing so that the surface roughness may be 1.6 µm and the flatness may be 185 and 20 µm.

Subsequently, on the ring structure 11a, a ring 21 made of silicon single crystal was placed. In the ring 21, an outer diameter (Rd) and a ring width (Rw), respectively, were set at 223 mm and 1.5 mm, and a thickness (Rt) was varied between 0.5, 0.7, 1.0, 2.0, 5.0 and 10.0 mm.

Furthermore, in a region where the ring 21 comes into contact with a semiconductor silicon substrate 8 and the ring structure 11a, the flatness was processed to be from 30 to 35 µm and the surface roughness to be from 0.7 to 1.6 µm.

As shown in FIG. 2, on the heat treatment jig 10 constituted into two-division structure in which the ring 21 is placed on the holder 11, a silicon substrate 8 was placed, the holder 11 was mounted on a heat treatment boat and put into a vertical heat treatment furnace (not shown in the drawing) followed by applying heat treatment.

After the heat treatment under the above conditions, the semiconductor silicon substrate 8 was taken out followed by surface observation. In the semiconductor silicon substrate 8 placed on the holder 11 whose ring structure has the flatness of 185 µm, when the thickness of the ring 21 was 0.5 mm, three large slips were generated.

However, in the case of the thickness of the ring 21 being from 0.7 to 2.0 mm, there were observed no thickness dependency. As the result of the reproducibility test, there was no occurrence of the slip or one to three fine slips were observed.

In the next place, the holder 11 that has the ring structure having the flatness of 20 µm exhibited substantially the same result as that of the holder 11 that has the flatness of 185 µm; however, the slips occurring in the case of the ring having the thickness of 0.5 mm tend to decrease.

Accordingly, it is found that the slips are likely to be influenced by the holder flatness and when the thickness of the ring 21 is thin influence on the occurrence of the slips becomes larger.

Figure 3:
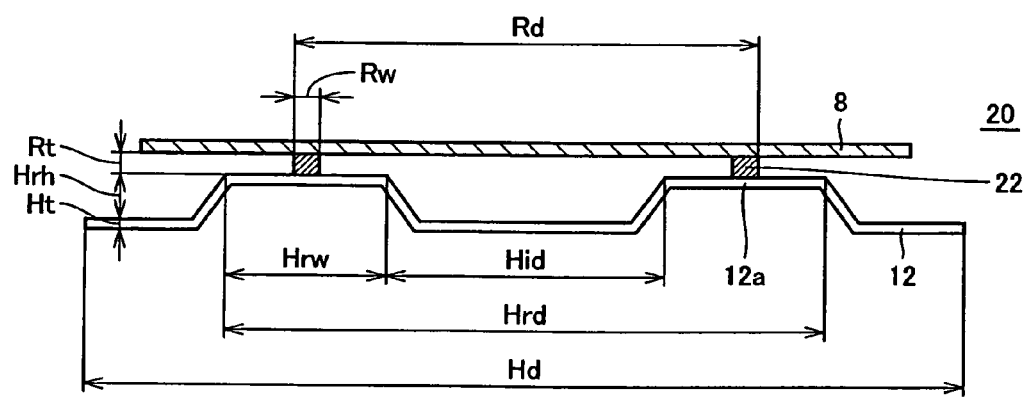
FIG. 3 is a diagram showing a configuration of a heat treatment jig 20 that is a second embodiment of the invention.

FIG. 3 is a diagram showing a configuration of a heat treatment jig 20 that is a second embodiment of the invention. A holder 12 that is used in the heat treatment jig 20 is made of vapor-phase grown silicon carbide and provided with a ring structure 12a.

The holder 12 has a diameter (Hd) of 320 mm and a thickness (Ht) of 1.5 mm; and the ring structure 12a has a height (Hrh) of 2.0 mm, an outer diameter (Hrd) of 285 mm, an inner diameter (Hid) of 203 mm and a width (Hrw) of 41 mm. The ring structure 12a of the holder 12 was subjected to the surface processing so that the flatness may be 40 µm and the surface roughness may be 1.6 µm.

Subsequently, on the ring structure 12a, a ring 22 made of silicon single crystal and having an outer diameter (Rd) of 223 mm, a thickness (Rt) of 2.0 mm and a width (Rw) varying in 0.5, 0.8 and 1.5 mm was placed.

Furthermore, a region where the ring 22 comes into contact with a semiconductor silicon substrate 8 and the ring structure 12a of the holder 12 was surface processed so that the flatness might be from 20 to 35 μm and the surface roughness might be 1.6 μm.

As shown in FIG. 3, on the heat treatment jig 20 constituted into two-division structure in which the ring 22 was thus placed on the holder 12, a semiconductor silicon substrate 8 was placed followed by mounting on a heat treatment boat further followed by putting into a vertical heat treatment furnace to apply heat treatment.

Similarly, after the heat treatment, the semiconductor silicon substrate 8 was taken out, followed by surface observation. The occurrence of the slips did not exhibit dependency on the width of the ring that was placed on the holder. Also from the result of the reproducibility test, there was no occurrence of the slip or only one to two fine slips were observed. Therefrom, it is understood that the width of the ring that supports the semiconductor silicon substrate may well be at least 0.5 mm.

Figure 4:
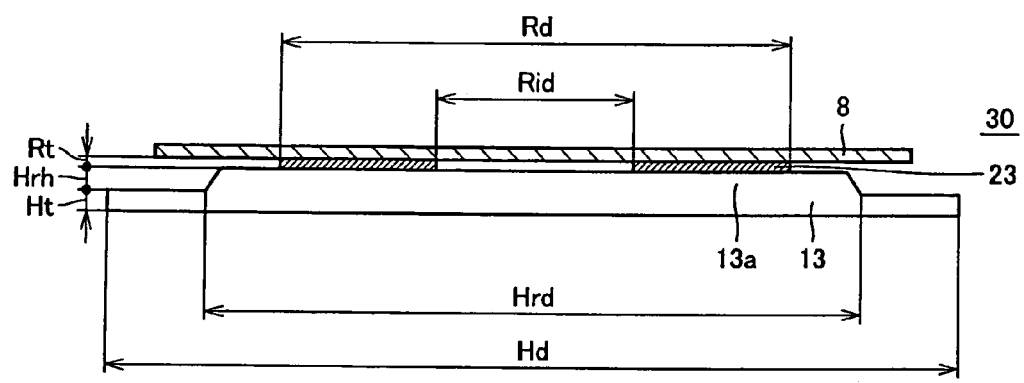
FIG. 4 is a diagram showing a configuration of a heat treatment jig 30 that is a third embodiment of the invention.

FIG. 4 is a diagram showing a configuration of a heat treatment jig 30 that is a third embodiment of the invention. A holder 13 that is used in the heat treatment jig 30 is made of sintered silicon carbide and provided with a disc structure 13a.

The holder 13 has a diameter (Hd) of 320 mm and a thickness (Ht) of 1.25 mm; and the disc structure 13a has a diameter of (Hrd) of 285 mm and a height (Hrh) of 0.75 mm. The disc structure 13a of the holder 13 was subjected to the surface processing so that the flatness might be 20 μm and the surface roughness might be 1.5 μm.

Subsequently, on the disc structure 13a, a ring 23 that is made of silicon single crystal and has an outer diameter (Rd) of 228 mm and an inner diameter (Rid) of 152 mm, and a thickness (Rt) of 2.0 mm was placed.

Furthermore, in a region where the ring 23 comes into contact with the semiconductor silicon substrate 8 and the disc structure 13a of the holder 13, the surface processing was applied so that the flatness might be 20 μm and the surface roughness might be from 1.6 to 1.7 μm.

As shown in FIG. 4, on the heat treatment jig 30 constituted into two-division structure in which the ring 23 is placed on the holder 13, a 300 mm semiconductor silicon substrate 8 was placed, followed by mounting on a heat treatment boat 1, further followed by putting into a vertical heat treatment furnace to apply heat treatment.

After the heat treatment, the semiconductor silicon substrate 8 was taken out, followed by surface observation. Similarly to the case of the heat treatment jig 20, the occurrence of the slips did not exhibit dependency on the width of the ring placed on the holder. Also from the result of the reproducibility test, there was no occurrence of the slip or only one to two fine slips were observed.

Figure 5:
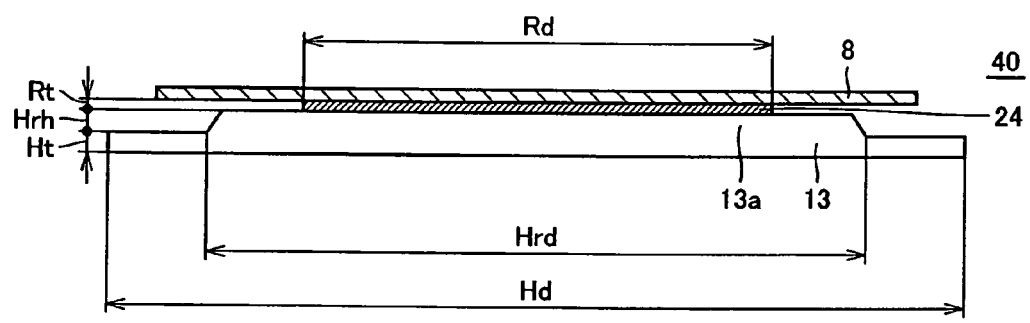
FIG. 5 is a diagram showing a configuration of a heat treatment jig 40 that is a fourth embodiment of the invention.

FIG. 5 is a diagram showing a configuration of a heat treatment jig 40 that is a fourth embodiment of the invention. A holder 13 that is used in the heat treatment jig 40 is made of sintered silicon carbide and provided with a disc structure 13a.

The holder 13 has a diameter (Hd) of 320 mm and a height (Ht) of 1.25 mm; and the disc structure 13a has a diameter (Hrd) of 285 mm and a height (Hrh) of 0.75 mm. The disc structure 13a of the holder 13 was subjected to the surface processing so that the flatness might be 20 μm and the surface roughness might be 1.5 μm.

On the disc structure 13a, a disc 24 made of silicon single crystal and having a diameter (Rd) of 223 mm and a thickness (Rt) of 2 mm was placed. In the disc 24, the flatness and the surface roughness, respectively, of portions where the disc 24 comes into contact with the semiconductor silicon substrate 8 and the disc structure 13a of the holder 13 were processed so as to be 30 μm and 1.5 μm.

On the heat treatment jig 40 constituted of the disc 24 and the holder 13, the semiconductor silicon substrate 8 was placed followed by mounting on a heat treatment boat further followed by putting into a vertical heat treatment furnace to apply heat treatment.

After the heat treatment, the semiconductor silicon substrate 8 was taken out, followed by surface observation. Even in the heat treatment jig 40 constituted into a disc structure, similarly to the case of the heat treatment jig 20, the occurrence of the slip was not observed or only one to two fine slips were observed.

Figure 6:
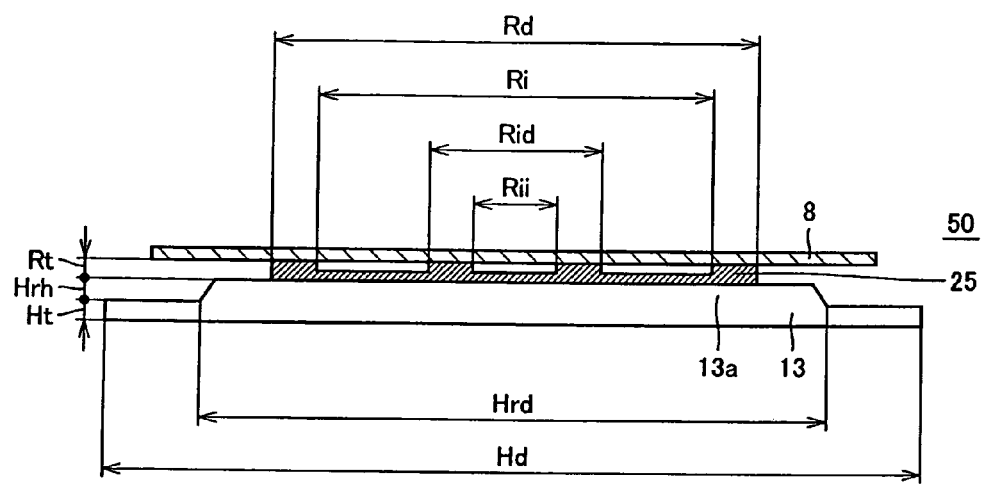
FIG. 6 is a diagram showing a configuration of a heat treatment jig 50 that is a fifth embodiment of the invention.

FIG. 6 is a diagram showing a configuration of a heat treatment jig 50 that is a fifth embodiment of the invention. A holder 13 that is used in the heat treatment jig 50 is made of sintered silicon carbide and provided with a disc structure 13a.

The holder 13 has a diameter (Hd) of 320 mm and a height (Ht) of 1.25 mm; and the disc structure 13a has a diameter (Hrd) of 285 mm and a height (Hrh) of 0.75 mm. The disc structure 13a of the holder 13 was subjected to the surface processing so that the flatness might be 20 μm and the surface roughness might be 1.5 μm.

On the disc structure 13a, a dual structure ring 25 having a thickness (Rt) of 3 mm was placed, the dual structure ring 25 being made of silicon single crystal and including an outer peripheral ring that has an outer diameter (Rd) of 230 mm and an inner diameter (Ri) of 220 mm, and further inside thereof, an inner peripheral ring that has an outer diameter (Rid) of 90 mm and an inner diameter (Rii) of 80 mm.

In the dual structure ring 25, the flatness and the surface roughness, respectively, of a portion thereof that comes into contact with the semiconductor silicon substrate 8 and the disc structure 13a of the holder 13 were finished so as to be 25 μm and 1.3 μm.

On the heat treatment jig 50 constituted of the dual structure ring 25 and the holder 13, the semiconductor silicon substrate 8 was placed followed by mounting on a heat treatment boat further followed by putting into a vertical heat treatment furnace to apply heat treatment.

After the heat treatment, the semiconductor silicon substrate 8 was taken out, followed by surface observation. Even in the heat treatment jig 50 constituted into an integrated dual structure ring, similarly to the case of the heat treatment jig 20, the occurrence of the slip was not observed or only one to two fine slips were observed.

Figure 7:
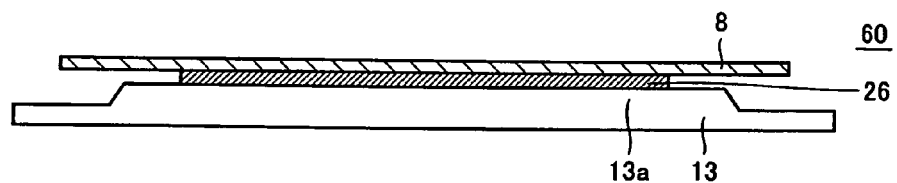
FIG. 7 is a diagram showing a configuration of a heat treatment jig 60 that is a sixth embodiment of the invention.

FIG. 7 is a diagram showing a configuration of a heat treatment jig 60 that is a sixth embodiment of the invention. In the heat treatment jig 60, a disc 26 with a silicon carbide film is used, the disc 26 with a silicon carbide film being formed by processing the disc 24 made of single crystal silicon that was used in the heat treatment jig 40 shown in FIG. 5.

The disc 26 with a silicon carbide film was fabricated in such a way that a silicon carbide film was deposited on a surface of the disc 24 shown in the FIG. 5, by means of a vapor-phase deposition method, with a thickness of 20 μm, thereafter irregular protrusions were removed by hand-polishing, and furthermore the blasting was applied so that the surface roughness might be 1.2 μm.

The disc 26 with a silicon carbide film, similarly to the FIG. 5, was placed on the disc structure 13a of the sintered silicon carbide holder 13, on the heat treatment jig 60 constituted of the disc 26 with a silicon carbide film and the holder 13, the semiconductor silicon substrate 8 was placed followed by mounting on a heat treatment boat further followed by putting into a vertical heat treatment furnace to apply heat treatment.

After the heat treatment, the semiconductor silicon substrate 8 was taken out and observed of the surface. Even when the surface of the heat treatment jig made of single crystal silicon was covered with a thin silicon carbide film, an effect the same as that in the heat treatment jig 40 was obtained. That is, since a silicon carbide coating is thin, the material characteristics (thermal expansion coefficient and so on) are supposed to depend on the silicon material.

Figure 8:
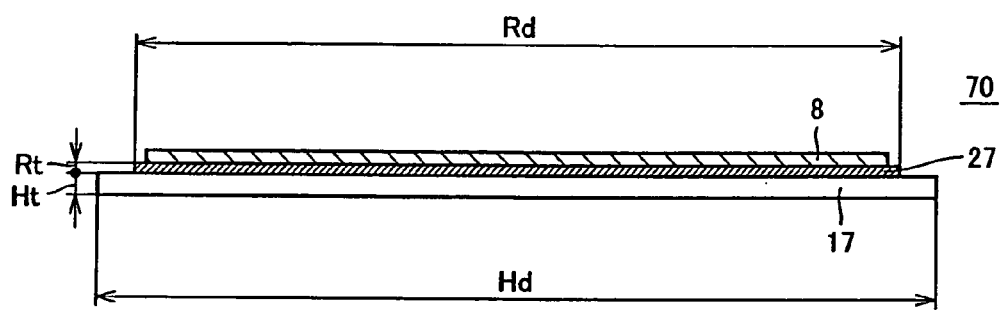
FIG. 8 is a diagram showing a configuration of a heat treatment jig 70 that is a seventh embodiment of the invention.

FIG. 8 is a diagram showing a configuration of a heat treatment jig 70 that is a seventh embodiment of the invention. In the heat treatment jig 70, a silicon carbide holder 17 having a diameter (Hd) of 320 mm, a thickness (Ht) of 3.0 mm, the flatness of 40 µm and the surface roughness of 1.2 µm is used.

On the holder 17, a disc 27 made of silicon single crystal material and having a diameter (Rd) of 305 mm, a thickness (Rt) of 2.0 mm, the surface roughness of 2.0 µm and the flatness of 20 µm was placed. On the heat treatment jig 70 formed into the dual structure, the semiconductor silicon substrate 8 was placed followed by mounting on the heat treatment boat 1 further followed by putting into a vertical heat treatment furnace to apply heat treatment.

After the heat treatment, the semiconductor silicon substrate 8 was taken out and observed of the surface thereof. Even when a heat treatment jig made of silicon material having a diameter larger than the semiconductor silicon substrate was used, the situation of slip occurrence was excellent.

Figure 9:
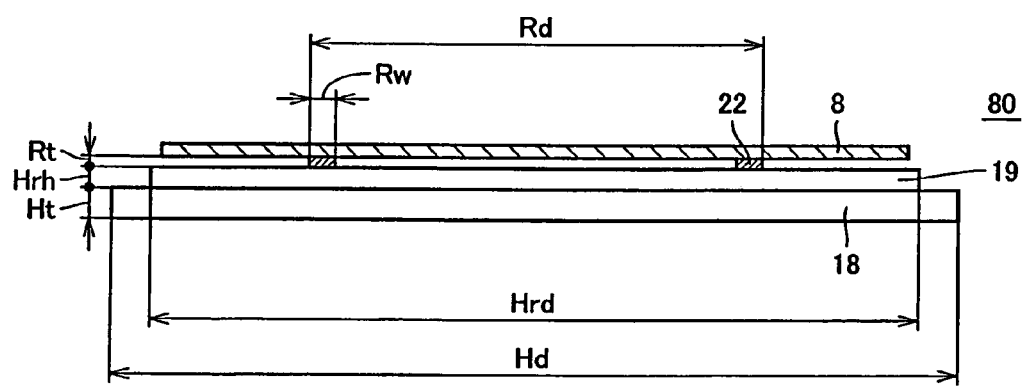
FIG. 9 is a diagram showing a configuration of a heat treatment jig 80 that is an eighth embodiment of the invention.

FIG. 9 is a diagram showing a configuration of a heat treatment jig 80 that is an eighth embodiment of the invention. In the heat treatment jig 80, a sintered silicon carbide holder 18 having a diameter (Hd) of 320 mm, a thickness (Ht) of 5.0 mm, the flatness of 25 µm and the surface roughness of 1.2 µm is used.

On the holder 18, a disc 19 that is similarly made of sintered silicon carbide and has a diameter (Hrd) of 305 mm, a thickness (Hrh) of 5.0 mm, the flatness of 20 µm and the surface roughness of 0.02 µm was further placed, and further thereon a silicon ring 22 that was used in the heat treatment jig 20 shown in FIG. 3 and has an outer diameter (Rd) of 223 mm, a thickness (Rt) of 2.0 mm and a ring width (Rw) of 1.5 mm was placed.

On the heat treatment jig 80 formed into a triple structure of the holder 18, the disc 19 and the ring 22, the semiconductor silicon substrate 8 was placed followed by mounting on the heat treatment boat further followed by putting into a vertical heat treatment furnace to apply heat treatment.

After the heat treatment, the semiconductor silicon substrate 8 was taken out and observed of the surface thereof. Even when a 5 mm thick disc was placed on a 5 mm thick holder to result in a 10 mm thickness in total, the slip occurrence could be excellently suppressed.

Figure 10:
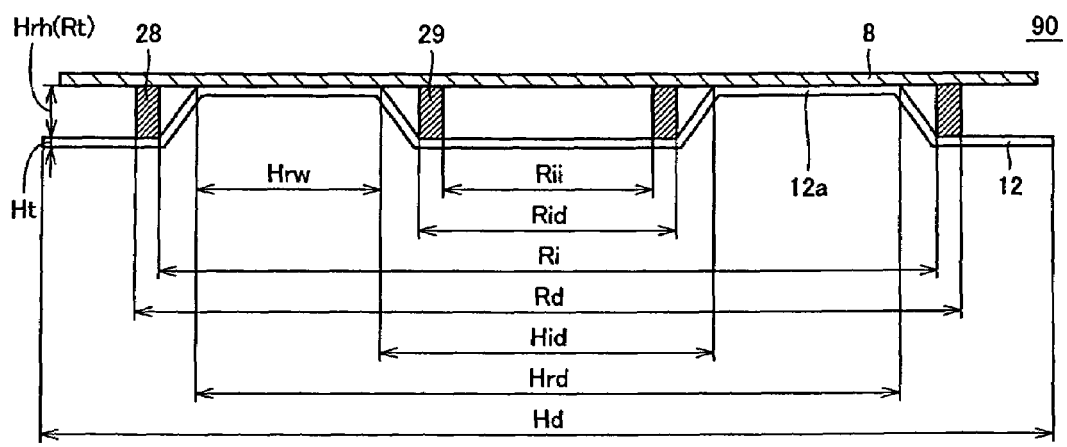
FIG. 10 is a diagram showing a configuration of the heat treatment jig 90 that is a ninth embodiment of the invention.

FIG. 10 is a diagram showing a configuration of a heat treatment jig 90 that is a seventh embodiment of the invention. A holder 12 that is used in the heat treatment jig 20 is made of vapor-phase grown silicon carbide and provided with a ring structure 12a.

The holder 12 has a diameter (Hd) of 320 mm and a thickness (Ht) of 1.5 mm; and the ring structure 12a has a height (Hrh) of 2.0 mm, an outer diameter (Hrd) of 285 mm, an inner diameter (Hid) of 203 mm and a width (Hrw) of 41 mm. The ring structure 12a of the holder 12 was subjected to the surface processing so that the flatness may be 40 µm and the surface roughness may be 1.6 µm.

Subsequently, along the periphery of the ring structure 12a, a ring 28 that is made of silicon single crystal and has an outer diameter (Rd) of 290 mm and an inner diameter (Ri) of 286 mm, and a thickness (Rt) of 2.0 mm, and also a ring 29 that is made of silicon single crystal and has an outer diameter (Rid) of 202 mm, an inner diameter (Rii) of 198 mm and a thickness (Rt) of 2 mm were placed.

Furthermore, in regions where the ring 28 and the ring 29 come into contact with the semiconductor silicon substrate 8 and the holder 12 was surface processed so that the flatness might be from 20 to 35 µm and the surface roughness might be 1.4 µm.

As shown in FIG. 10, on the heat treatment jig 90 constituted into two-division structure in which the ring 28 and the ring 29 were thus placed on the holder 12, a semiconductor silicon substrate 8 was placed followed by mounting on a heat treatment boat further followed by putting into a vertical heat treatment furnace to apply heat treatment.

Similarly, after the heat treatment, the semiconductor silicon substrate 8 was taken out. Followed by surface observation. Even in the heat treatment jig 90 constituted into the structure that was supported on the both surfaces of silicon carbide and silicon ring, similarly to the case of the heat treatment jig 90, the occurrence of the slip was not observed or only two to three fine slips were observed.

In the case of using the ring 28 or the ring 29, the reduction of the slip was also effective. (not showing in the drawing).

Furthermore, though not shown in the drawing, on a sintered silicon carbide holder having a diameter of 320 mm, a thickness of 0.7 mm, the flatness of 150 µm and the surface roughness of 0.6 µm, a silicon ring 23 that was used in the heat treatment jig 30 shown in FIG. 4 and has a height varying in 0.5 mm, 1.0 mm, 5.0 mm and 10 mm was placed, followed by mounting a semiconductor silicon substrate further thereon, further followed by putting into a vertical heat treatment furnace.

After the heat treatment, the semiconductor silicon substrate 8 was taken out followed by observing the surface thereof. When the height of the silicon ring was 0.5 mm, four to five fine slips were generated. It was found that when the height of the silicon ring was 1.0 mm, the slip occurrence further decreased than in the case of the height being 0.5 mm, and when the height was 5.0 mm the slip occurrence was the same as the cases of the heat treatment jigs 20 and 30.

That is, it was found that even in the case of silicon carbide being thin, when a thickness of a silicon heat treatment jig disposed thereon increases, the mechanical strength thereof becomes stronger, resulting in exhibiting an effect of reducing the slip.

COMPARATIVE EMBODIMENT

Figure 11:
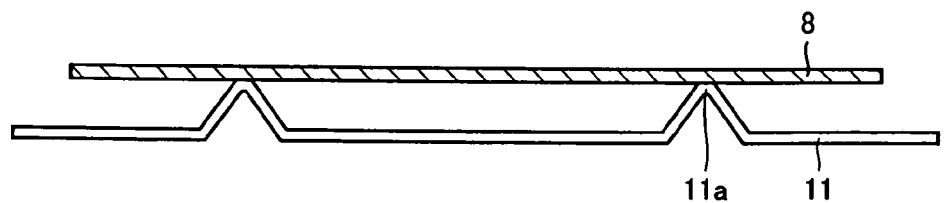
FIG. 11 is a diagram showing a configuration of a comparative embodiment 1 where a holder 11 of the heat treatment jig 10 shown in FIG. 2 is used but a ring 21 that is made of silicon single crystal is not used.
Figure 12:
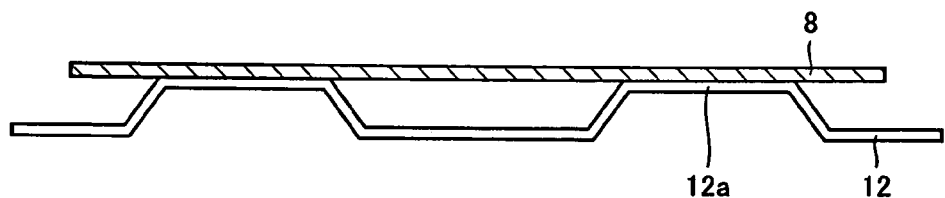
FIG. 12 is a diagram showing a configuration of a comparative embodiment 2 where a holder 12 of the heat treatment jig 20 shown in FIG. 3 is used but a ring 22 made of silicon single crystal is not used.
Figure 13:
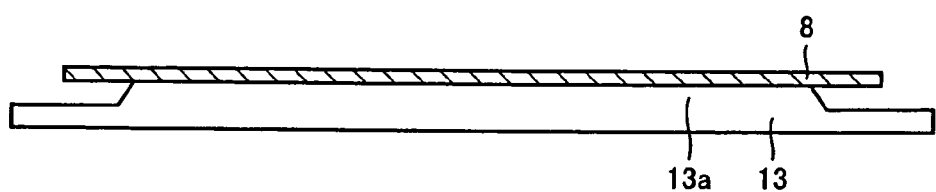
FIG. 13 is a diagram showing a configuration of a comparative embodiment 3 where a holder 13 of the heat treatment jig 30 shown in FIG. 4 is used but a ring 23 made of silicon single crystal is not used.

FIGS. 11 through 13 are diagrams showing configurations of heat treatment jigs that are comparative embodiments. FIG. 11 is a diagram showing a configuration of comparative embodiment 1 where the holder 11 of the heat treatment jig 10 shown in FIG. 2 is used but the ring 21 that is made of silicon single crystal is not used.

FIG. 12 is a diagram showing a configuration of comparative embodiment 2 where the holder 12 of the heat treatment jig 20 shown in FIG. 3 is used but the ring 22 that is made of silicon single crystal is not used. FIG. 13 is a diagram showing a configuration of comparative embodiment 3 where the holder 13 of the heat treatment jig 30 shown in FIG. 4 is used but the ring 23 that is made of silicon single crystal is not used.

In all cases shown in FIGS. 11 through 13, without using the rings 21, 22 and 23 shown in FIGS. 2 through 4, semiconductor silicon substrates 8 were directly placed followed by putting into a vertical heat treatment furnace.

In comparative embodiment 1 shown in FIG. 11, in the case of a holder that has the flatness of 185 µm, in a ring supporting position along a circumference of 221 mm, a lot of large slips occurred; also in the case of a holder that has the flatness of 20 µm, the slips occurred similarly a lot but decreasing tendency was exhibited.

In comparative embodiment 2 shown in FIG. 12, ten and several large slips occurred in a region corresponding to a circumferential position of an outer diameter of 285 mm, and several fine slips also occurred along a periphery of an inner periphery of 203 mm. Furthermore, also in a plane of a holder that supports the semiconductor silicon substrate, cross-shaped slips occurred.

In comparative embodiment 3 shown in FIG. 13, similarly to comparative embodiment 2, in a region corresponding to a circumferential position of an outer diameter of 285 mm, several long fine slips occurred.

According to results of comparative embodiments 1 through 3, in the case of only the holder (made of silicon carbide) being used, the slips occurred in the surroundings of a supporting surface; accordingly, it is assumed that a back surface of the semiconductor silicon substrate that comes into contact with the surroundings of the supporting portion is bruised, and with this as starting points the slips grow.

In the heat treatment jig for semiconductor substrate, configurations having a silicon carbide holder alone, under all conditions, could not suppress the slip from occurring. When a first jig made of single crystal silicon is mounted on the holder, thereby forming into a two-division structure, the occurrence of the slips can be suppressed or largely suppressed from occurring.

What is claimed is:

1. A heat treatment jig for a semiconductor substrate that is mounted on a heat treatment boat of a vertical heat treatment furnace, comprising:
    a semiconductor substrate that is heat treated;
    a first jig that is constituted of a silicon material and comes into direct contact with the semiconductor substrate to support; and
    a second jig (holder) that holds the first jig and is mounted on the heat treatment boat, wherein the first jig is placed on the second jig so that the first jig is movable relative to the second jig on the surface of the second jig.

2. The heat treatment jig for a semiconductor substrate according to claim 1:
    wherein the first jig has, in a region that comes into direct contact with the semiconductor substrate, a thickness in the range of from 0.5 to 10 mm, the surface roughness in the range of from 0.02 to 10 µm and the flatness of 100 µm or less; and
    the second jig has, in a region that comes into direct contact with the first jig, a thickness in the range of from 0.5 to 10 mm, the surface roughness in the range of from 0.02 to 10 µm and the flatness of 200 µm or less.

3. The heat treatment jig for a semiconductor substrate according to claim 1:
    wherein the first jig is 0.5 mm or more in a width that comes into direct contact with the semiconductor substrate.

4. The heat treatment jig for a semiconductor substrate according to claim 2:
    wherein the first jig is 0.5 mm or more in a width that comes into direct contact with the semiconductor substrate.

5. A heat treatment jig for a semiconductor substrate according to claim 1:
    wherein in the first jig, on a surface of a region that comes into direct contact with the semiconductor substrate, any one of a silicon carbide film, an oxide film or a poly-silicon film is formed.

6. A heat treatment jig for a semiconductor substrate according to claim 2:
    wherein in the first jig, on a surface of a region that comes into direct contact with the semiconductor substrate, any one of a silicon carbide film, an oxide film or a poly-silicon film is formed.

7. A heat treatment jig for a semiconductor substrate according to claim 3:
    wherein in the first jig, on a surface of a region that comes into direct contact with the semiconductor substrate, any one of a silicon carbide film, an oxide film or a poly-silicon film is formed.

8. A heat treatment jig for a semiconductor substrate according to claim 4:
    wherein in the first jig, on a surface of a region that comes into direct contact with the semiconductor substrate, any one of a silicon carbide film, an oxide film or a poly-silicon film is formed.

* * * * *